United States Patent [19]

Takei et al.

[11] Patent Number: 4,672,409
[45] Date of Patent: Jun. 9, 1987

[54] NONVOLATILE SEMICONDUCTOR MEMORY DEVICE

[75] Inventors: Akira Takei; Yoshihiko Hika, both of Yokohama; Takashi Miida, Tokyo, all of Japan

[73] Assignee: Fujitsu Limited, Kanagawa, Japan

[21] Appl. No.: 746,452

[22] Filed: Jun. 19, 1985

Related U.S. Application Data

[63] Continuation of Ser. No. 333,651, Dec. 23, 1981, abandoned.

[30] Foreign Application Priority Data

Dec. 25, 1980 [JP]  Japan ................. 55-182745
Apr. 30, 1981 [JP]  Japan ................. 56-65424
Apr. 30, 1981 [JP]  Japan ................. 56-65540

[51] Int. Cl.$^4$ .................. H01L 29/78; H01L 29/34; H01L 29/04; G11C 11/40
[52] U.S. Cl. ..................... 357/33.5; 357/23.11; 357/54; 357/59; 357/91; 365/185
[58] Field of Search .............. 357/23.5, 23.6, 54, 357/59, 91; 365/185

[56] References Cited

U.S. PATENT DOCUMENTS

| | | | |
|---|---|---|---|
| 3,654,499 | 4/1972 | Smith | 357/23 VT |
| 3,911,464 | 10/1975 | Chang et al. | 357/23 VT |
| 3,916,390 | 10/1975 | Chang et al. | 357/23 VT |
| 4,115,914 | 9/1978 | Harari | 357/23 VT |
| 4,173,766 | 11/1979 | Hayes | 357/23 VT |
| 4,375,085 | 2/1983 | Grise et al. | 357/54 |
| 4,375,086 | 2/1983 | van Velthoven | 357/23 VT |
| 4,375,087 | 2/1983 | Wanlass | 357/23 VT |

FOREIGN PATENT DOCUMENTS 54-148341  11/1979  Japan .

OTHER PUBLICATIONS

Kondo et al, "Dynamic Injection MNOS Memory Device" Proc. 11th Conf (1979 Int.) Solid State Devices, pp. 231–237.
Larsen et al, "Floating–Gate Device with Dual Control Gate" IBM Technical Disclosure Bulletin, vol. 21 (1/79) p. 3368.
Fowler, "Switchable Diode with Control Electrode" IBM Technical Disclosure Bulletin, vol. 16 (8/73) pp. 870–871.

Primary Examiner—Gene M. Munson
Attorney, Agent, or Firm—Staas & Halsey

[57] ABSTRACT

A nonvolatile semiconductor memory device including at least one memory cell which comprises a floating-gate, a control gate and a single impurity diffusion region formed exclusively for the memory cell. In this device, a small depletion region and a large depletion region due to the charged and discharged state of the floating-gate represent the information "1" and "0".

18 Claims, 43 Drawing Figures

Fig. 12 (1)
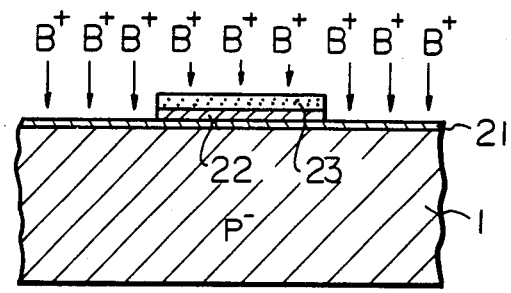
Fig. 12 (2)
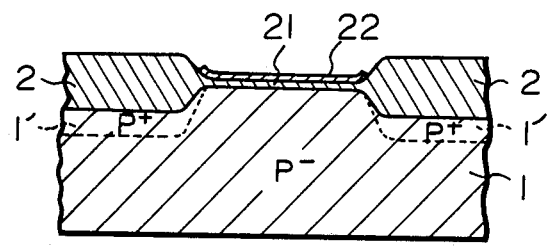
Fig. 12 (3)
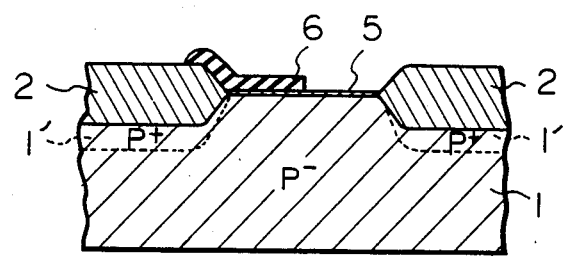

Fig. 12 (4)
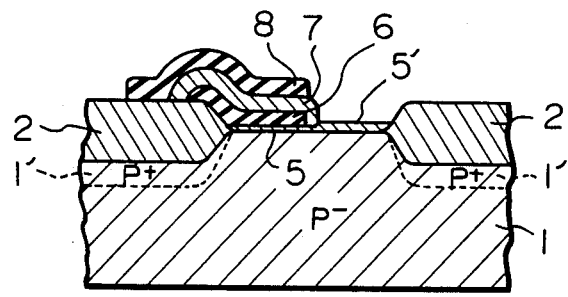
Fig. 12 (5)
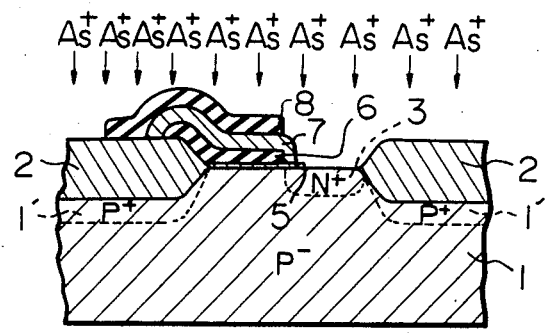

Fig. 13 (4)
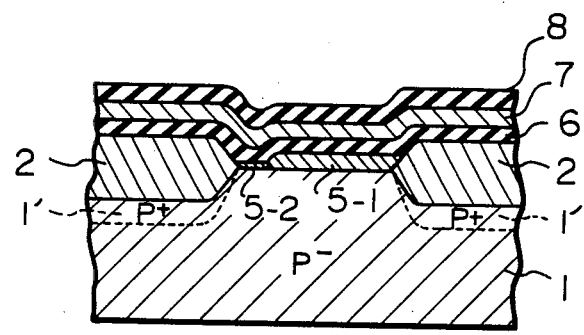
Fig. 13 (5)
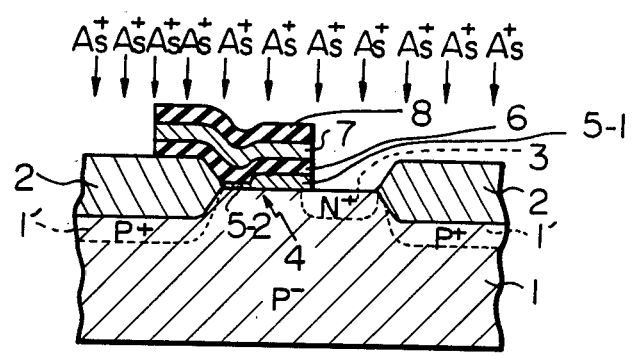

Fig. 14 (4)
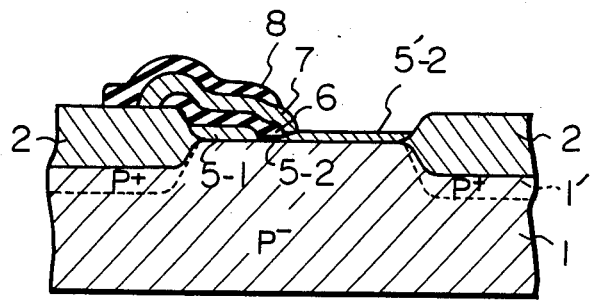
Fig. 14 (5)
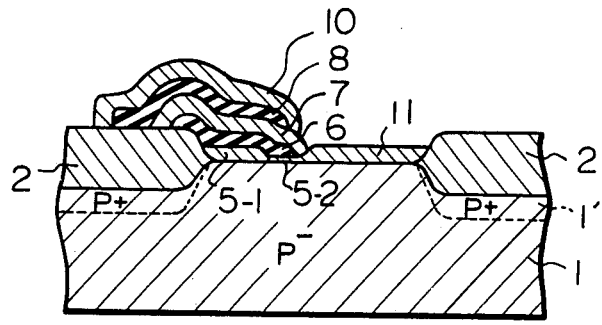
Fig. 14 (6)
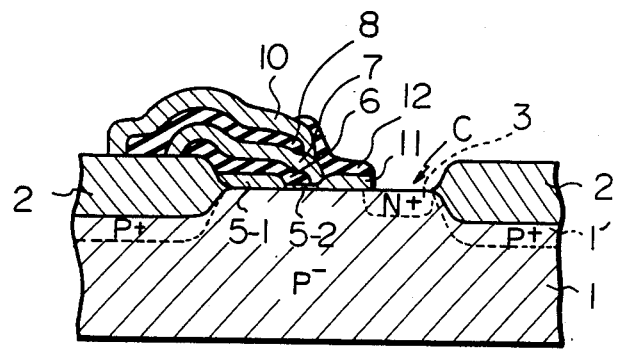

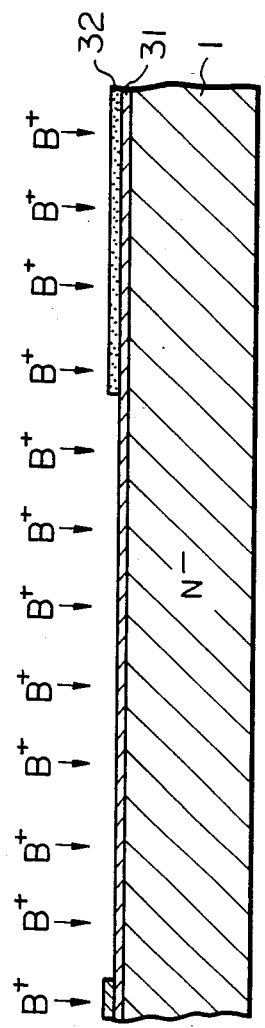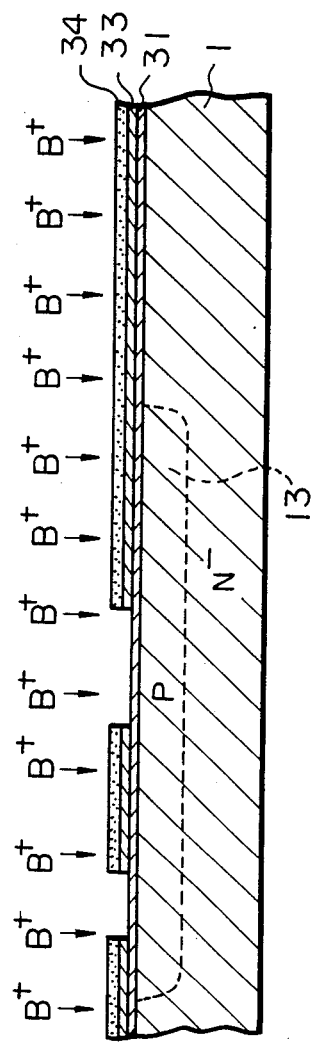

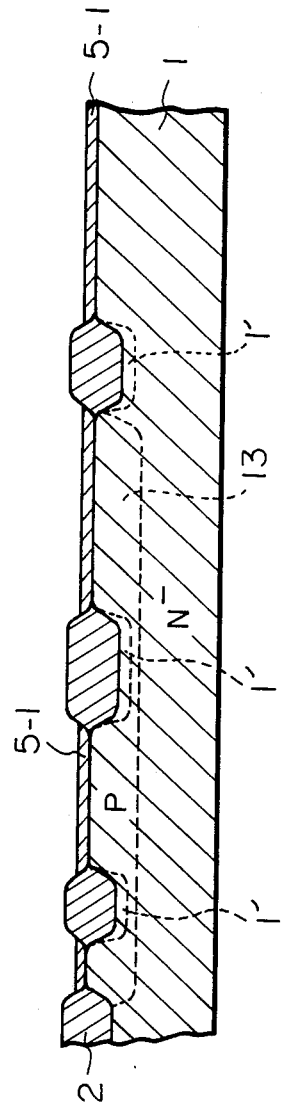
Fig. 15 (5)
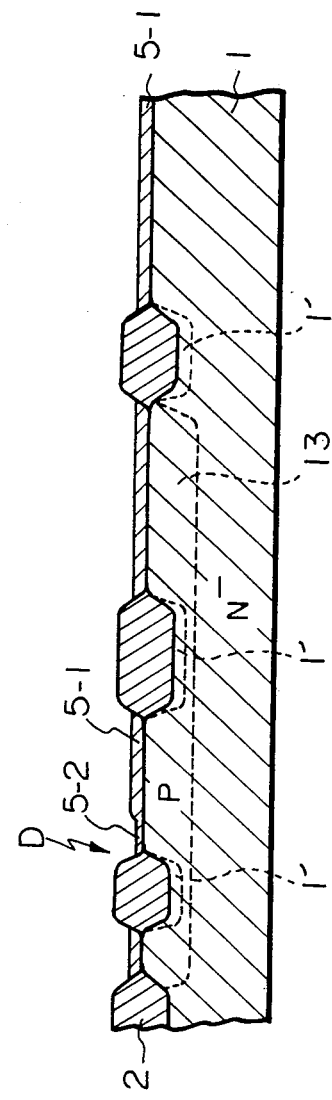
Fig. 15 (6)

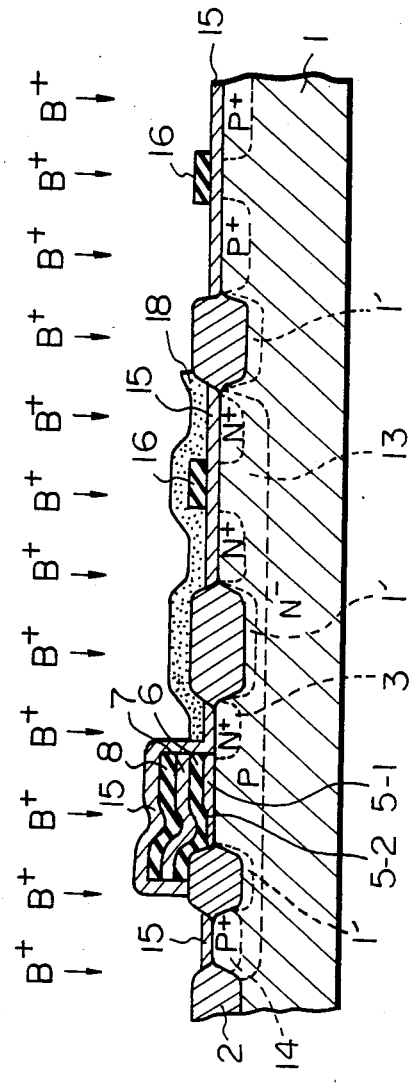
Fig. 15 (11)

NONVOLATILE SEMICONDUCTOR MEMORY DEVICE

The subject application is a continuation of Ser. No. 333,651, filed Dec. 23, 1981 and now abandoned.

BACKGROUND OF THE INVENTION

The present invention relates to a nonvolatile semiconductor memory device and, more particularly, to a nonvolatile semiconductor memory device of a floating-gate type.

One conventional nonvolatile semiconductor memory device of a floating-gate type comprises two gates: a floating-gate which is formed between two impurity diffusion regions within a semiconductor substrate and a control gate which is formed above the floating-gate. In this case, the floating-gate, the control gate and the semiconductor substrate are insulated from each other. The write and erase operation for this device, that is, the charging and discharging operation of the floating-gate thereof, is performed by the tunnel effect or avalanche breakdown. For example, in an n-channel type device, accumulation of electrons in the floating-gate results in a high threshold value, while expulsion of electrons from the floating-gate results in a low threshold value. Such two states correspond to the memory states "1" and "0". In other words, in the case of applying a predetermined potential to the control gate, the off-state and the on-state, which represent the absence and presence of a channel under the floating-gate and within the semiconductor substrate, respectively correspond to the memory states "1" and "0".

However, in the above-mentioned conventional device, since each memory cell requires two impurity diffusion regions, that is, a source region and a drain region, the device is large in size and, accordingly, the integration density thereof is decreased.

SUMMARY OF THE INVENTION

It is a principal object of the present invention to provide a nonvolatile semiconductor memory device having a large integration density.

It is another object of the present invention to provide a nonvolatile semiconductor memory device having good retention characteristics.

It is still another object of the present invention to provide a nonvolatile semiconductor memory device having a high read speed.

According to the present invention, there is provided a nonvolatile semiconductor memory device including at least one memory cell formed on a semiconductor substrate of a first conductivity type, each memory cell comprising: a single region of a second conductivity type formed exclusively for the memory cell in the semiconductor substrate; a first gate formed above the semiconductor substrate and adjacent to the single region, the first gate being insulated from the semiconductor device; a second gate formed above and being insulated from the first gate; whereby the charged or discharged state of the first gate may allow a depletion region to be generated under the first gate, the magnitude of the depletion region representing the memory state "1" or "0".

According to the present invention, there is also provided a nonvolatile semiconductor memory device formed on a well region of a first conductivity type which is formed within a semiconductor substrate of a second conductivity type, comprising: a first region of the second conductivity formed in the well region; a second region of the first conductivity type which is more heavily doped than the well region; a first gate formed above the semiconductor substrate and between the first and second regions; a second gate formed above the first gate and being insulated from the first gate; an insulating layer which isolates the first gate from the well region, the insulating layer having a thin portion apart from the first region and a thick portion adjacent to the first region; whereby the charged or discharged state of the first gate allows a depletion region to be generated under the first gate, the magnitude of the depletion region representing the memory state "1" or "0", and wherein the first gate is charged by applying potentials to the first region and the second gate so as to cause the tunnel effect, and the first gate is discharged by applying potentials to the second region and the second gate so as to cause the tunnel effect.

BRIEF DESCRIPTION OF THE DRAWINGS

The present invention will be more clearly understood from the description as set forth with reference to the accompanying drawings, wherein:

FIGS. 12 (1) through 12 (5) are cross-sectional views for explaining the manufacturing steps of the memory cell of FIG. 1;

DETAILED DESCRIPTION OF THE PREFERRED EMBODIMENTS

Figure 1:
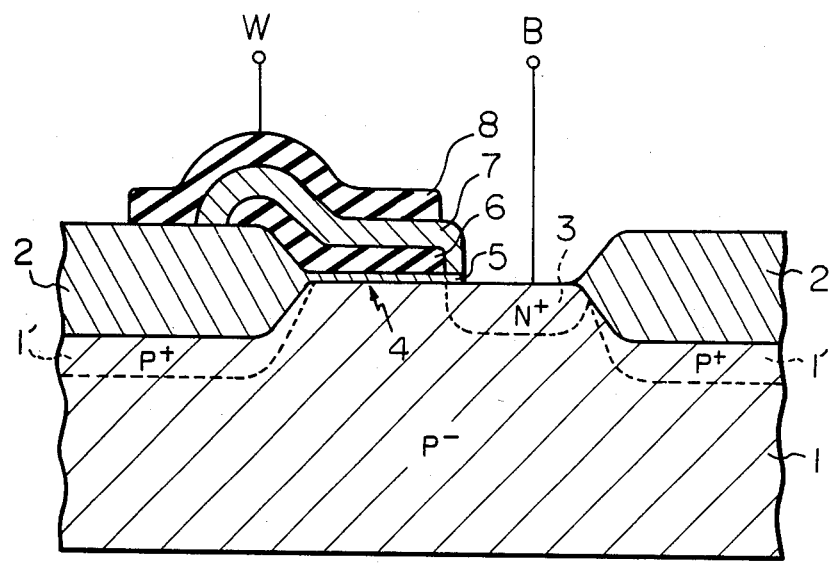
FIG. 1 is a cross-sectional view illustrating a first embodiment of one memory cell of the nonvolatile semiconductor memory device according to the present invention.

In FIG. 1, which illustrates a first embodiment of one memory cell of the nonvolatile semiconductor memory device according to the present invention, 1 is a p$^-$-type monocrystalline silicon substrate; 1' is a diffusion region which acts as a channel stopper; and 2 is a relatively thick field insulating layer which defines a field area. In an active area not having the field insulating layer 2, a single impurity diffusion region 3, which is one of the features of the present invention, and a channel region 4 are formed. In this case, the impurity diffusion region 3 is of an N+-type having a high density and is obtained by introducing phosphorus (P) or arsenic (As). A floating-gate 6, which is formed above the channel region 4 of the substrate 1, is insulated from the substrate 1 by a first insulating layer 5 which is thin enough to cause the tunnel effect. In this case, the insulating layer 5 is, for example, 100 to 120 Å of silicon dioxide ($SiO_2$). In addition, a control gate 8 is formed above the floating-gate 6 and is insulated therefrom by a second insulating layer 7 which is about 1000 Å of silicon dioxide ($SiO_2$).

Note that there are other insulating layers, such as a phospho-silicate glass (PSG) layer, and connections; however, the insulating layers and the connections are omitted from FIG. 1 for simplicity.

Figure 2A:
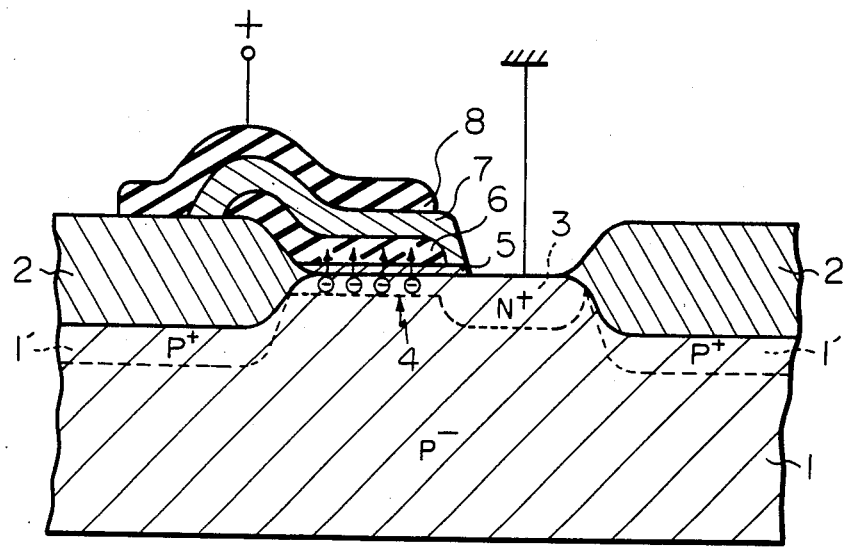
FIGS. 2A and 2B are cross-sectional views for explaining the write operation and the erase operation, respectively, of the memory cell of FIG. 1.

FIG. 2A is a cross-sectional view for explaining the write operation of the memory cell of FIG. 1. In order to inject electrons from the substrate 1 into the floating-gate 6, the potential of a bit line terminal B (see FIG. 1) remains low (zero), and, in addition, the potential of a word line terminal W (see FIG. 1) is increased to a positive high voltage which is, for example, 20 to 25 volts. As a result, as is illustrated in FIG. 2A, a channel which is also called an inversion region is generated in the channel region 4. Therefore, the electrons generated in the channel are injected into the floating-gate 6 due to the tunnel effect. Thus, the floating-gate 6 is charged, and, accordingly, the write operation is completed. Note that if the write operation is not desired, both the potentials of the bit line terminal B and the word line terminal W are increased to a high voltage so that no electrons are injected into the floating-gate 6 even when a channel is formed.

Figure 2B:
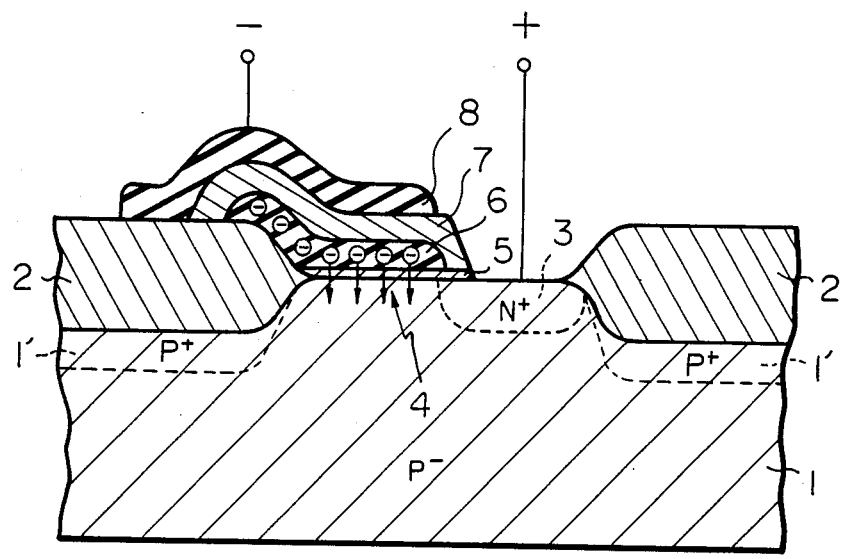

FIG. 2B is a cross-sectional view for explaining the erase operation of the memory cell of FIG. 1. In order to expel the electrons from the floating-gate 6 into the substrate 1, the potential of the bit line terminal B is increased to a positive high voltage 10 to 12 volts for example, and, in addition, the potential of the word line terminal W is decreased to a negative voltage, −10 to 12 volts for example. As a result, the electrons which are accumulated in the floating-gate 6 are expelled into the substrate 1. Thus, the floating-gate 6 is discharged, and, accordingly, the erase operation is completed.

Note that the above-mentioned write operation and erase operation are the same as in the case of the conventional device in which there are two impurity diffusion regions.

Figure 3A:
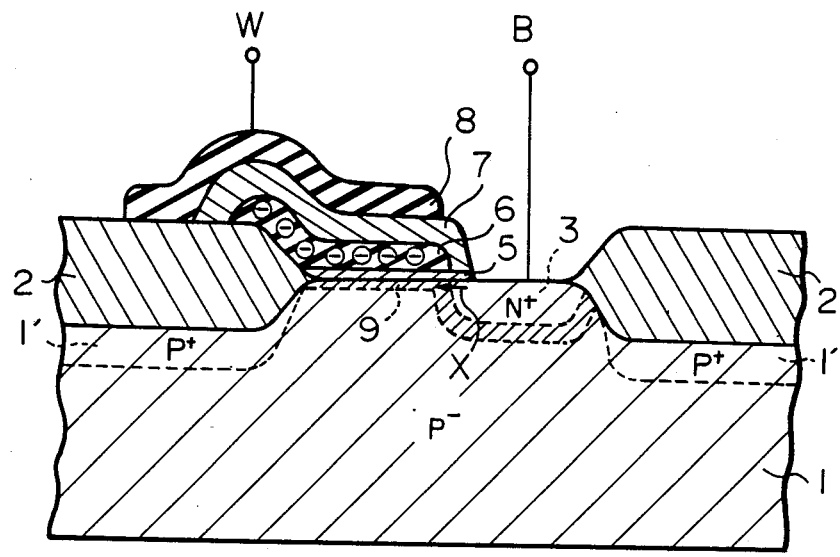
FIGS. 3A and 3B are cross-sectional views for explaining the read operation of the memory cell of FIG. 1.
Figure 3B:
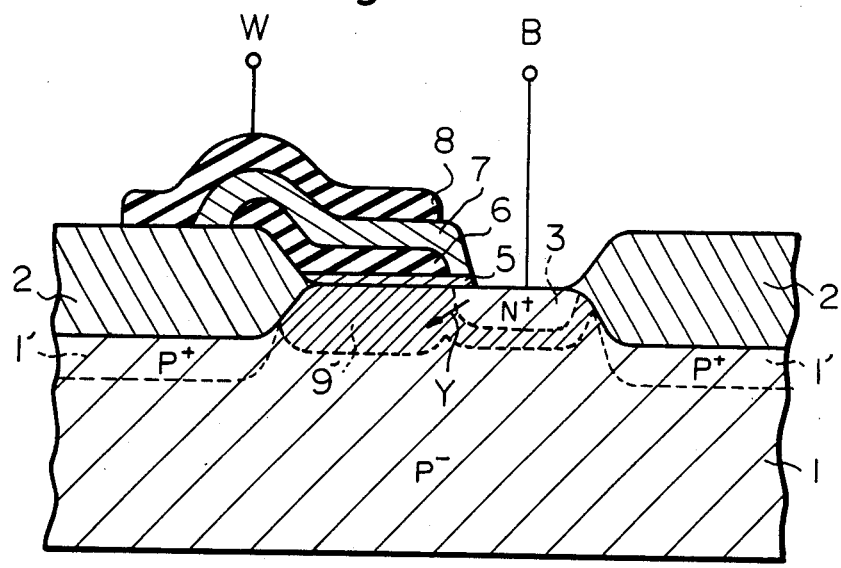

Next, the read operation of the device of FIG. 1 will be explained with reference to FIGS. 3A and 3B. FIG. 3A shows the state in which electrons are accumulated in the floating-gate 6, while FIG. 3B shows the state in which no electrons are present in the floating-gate 6. During the read operation, the bit line terminal B is in a floating state, and, in addition, a predetermined positive voltage which is, for example, 5 volts is applied to the word line terminal W.

As is illustrated in FIG. 3A, due to the presence of electrons in the floating-gate 6, a small depletion region 9 appears in the channel region 4. Contrary to this, as is illustrated in FIG. 3B, due to the absence of electrons in the floating-gate 6, a large depletion region 9' appears in the channel region 4. Therefore, in FIG. 3A, when a positive voltage is applied to the word line terminal W, the small depletion region 9 increases so that electrons flow from the impurity region 3 into the depletion region 9, indicated by an arrow X. Similarly, in FIG. 3B, when a positive voltage is applied to the word line terminal W, the large depletion region 9' increases so that electrons flow from the impurity region 3 into the depletion region 9', indicated by an arrow Y. Note that the current due to the motion of electrons in FIG. 3B is much larger than the current due to the motion of electrons in FIG. 3A. Therefore, the memory state "1" or "0" is read out by detecting such currents which are, in this case, dependent upon the total thickness of the insulating layers 5 and 7 and the area of the channel region 4.

In the device of FIG. 1, during the read operation, the potential of the bit line terminal B is a positive voltage (which is, however, in a floating state), and, in addition, the potential of the word line terminal W is a positive voltage or zero. Therefore, it happens that the potential of the bit line terminal B increases as compared with that of the floating-gate 6, which may cause the tunnel effect. That is, the electrons accumulated in the floating-gate 6 pass through the thin insulating layer 5 for a long time so that the information stored in the device of FIG. 1 is erased. Such bad retention characteristics are improved by the following embodiments.

Figure 4:
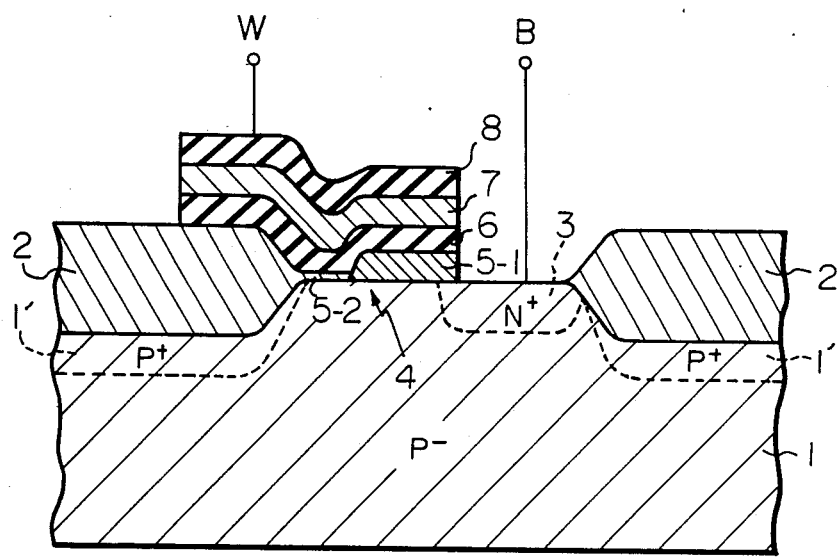
FIG. 4 is a cross-sectional view illustrating a second embodiment of one memory cell of the nonvolatile semiconductor memory device according to the present invention.

FIG. 4 is a cross-sectional view illustrating a second embodiment of one memory cell of the nonvolatile semiconductor memory device according to the present invention. The memory cell of FIG. 4 is similar to the memory cell of FIG. 1. However, the floating-gate 6 is insulated from the substrate 1 by an insulating layer having a thick portion 5-1 adjacent to the impurity region 3 and a thin portion 5-2 apart from the impurity region 3. In this case, the thin portion 5-2 is thin enough to cause the tunnel effect. That is, the thin portion 5-2 is, for example, about 100 to 120 Å thick silicon dioxide ($SiO_2$), while the thick portion 5-1 is, for example, 500 to 1200 Å thick silicon dioxide ($SiO_2$).

Note that the write operation of the memory cell of FIG. 4 is performed by using the tunnel effect and the erase operation of the memory cell of FIG. 4 is performed by using the avalanche breakdown.

Figure 5A:
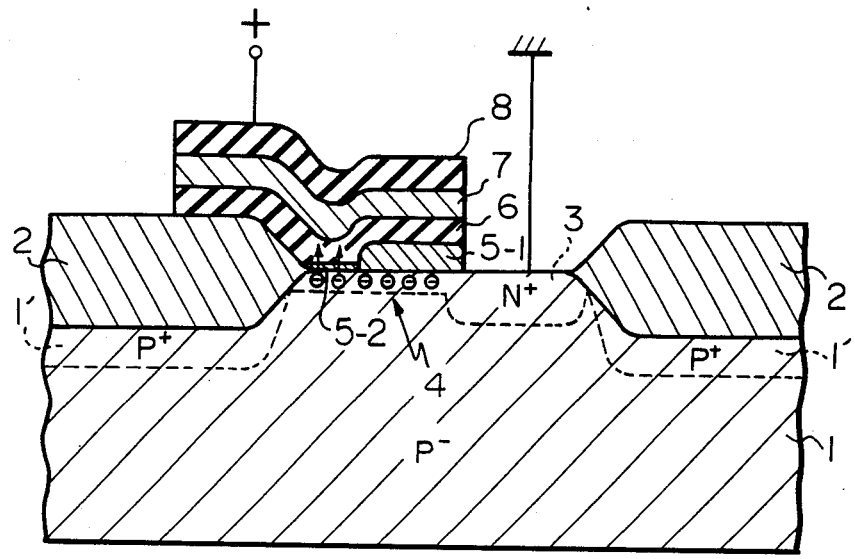
FIGS. 5A and 5B are cross-sectional views for explaining the write operation and the erase operation, respectively, of the memory cell of FIG. 4.

The write operation of the memory cell of FIG. 4 will be explained with reference to FIG. 5A. That is, the potential of the bit line terminal B remains low (zero), and, in addition, the word line terminal W is increased to a high voltage. As a result, a channel (inversion region) forms very quickly in the channel region 4 and extends beneath the thin portion 5-2 so that electrons flow through the thin portion 5-2 into the floating-gate 6 due to the tunnel effect. Note that if the write operation is not desired, the potentials of the bit line terminal B and the word line terminal W are both increased to a high voltage.

Figure 5B:
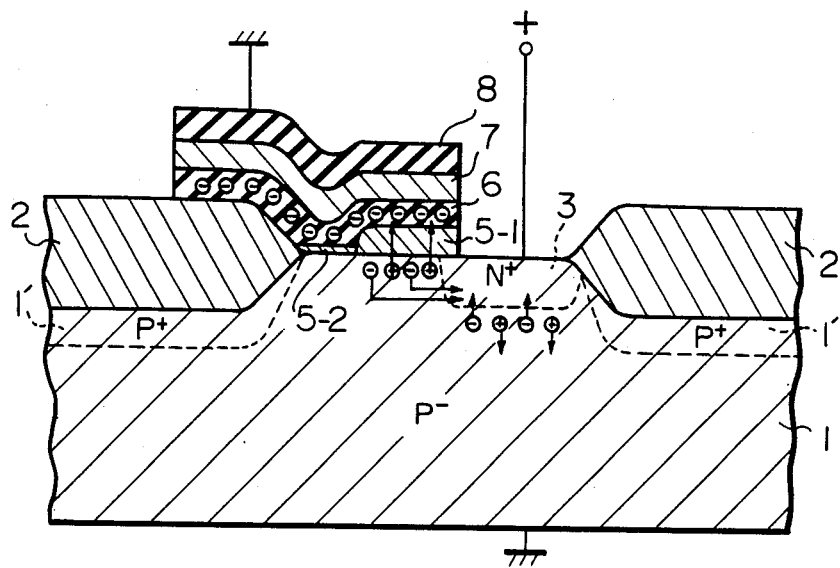

The erase operation of the memory cell of FIG. 4 will be explained with reference to FIG. 5B. That is, the potential of the bit line terminal B is increased to a positive high voltage, and, in addition, the potential of the word line terminal W remains low (zero). In this case, the potential of the substrate 1 is also low (zero). As a result, an avalanche breakdown takes place in the vicinity of the p-n junction built between the impurity diffusion region 3 and the substrate 1 so that pairs of hot electrons and hot holes are generated. Since the potential of the bit line terminal B is positive, the hot electrons are injected into the impurity region 3. In addition, some of the hot holes pass out of the substrate 1; however, some of such holes clear an energy barrier built between the thick portion 5-1 and the substrate 1 and reach the floating-gate 6 due to the zero potential of the word line terminal W. As a result, the holes which are injected into the floating-gate 6 are combined with the electrons accumulated therein. Therefore, the floating-gate 6 is discharged, and, accordingly, the information stored therein is erased.

Note that the read operation of the memory cell of FIG. 4 is the same as that of the memory cell of FIG. 1.

Thus, as explained above, since the insulating layer between the floating-gate 6 and the substrate 1-has a thick portion 5-1, the floating-gate 6 is surely separated from the substrate 1, and, accordingly, the retention time for storing the information becomes long.

Figure 6:
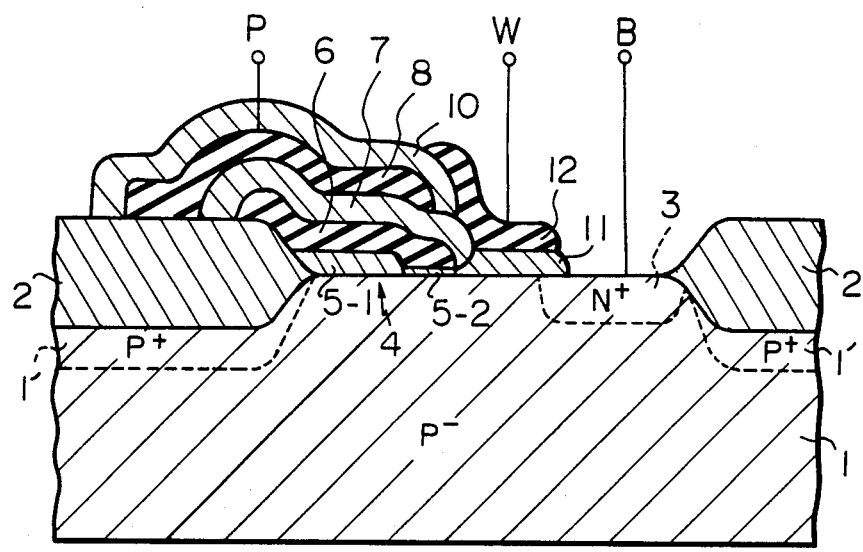
FIG. 6 is a cross-sectional view of a third embodiment of one memory cell of the nonvolatile semiconductor memory device according to the present invention.

FIG. 6 is a cross-sectional view illustrating a third embodiment of one memory cell of the nonvolatile semiconductor memory device according to the present invention. In FIG. 6, the floating-gate 6 is also insulated from the substrate 1 by an insulating layer having a thick portion 5-1 and a thin portion 5-2. In addition, a third gate 12 is provided. The third gate 12 is insulated from the floating-gate 6, the control gate 8 and the substrate 1 by insulating layers 7, 10 and 11. One of the features in the memory cell of FIG. 6 is that the write operation, the erase operation and the read operation are performed only when a channel is formed under the third gate 12. As a result, the effective stray capacity of the bit line B becomes small, thereby increasing the read speed thereof.

Note that the write operation and the erase operation of the memory cell of FIG. 6 are both performed by making use of the tunnel effect.

Figure 7A:
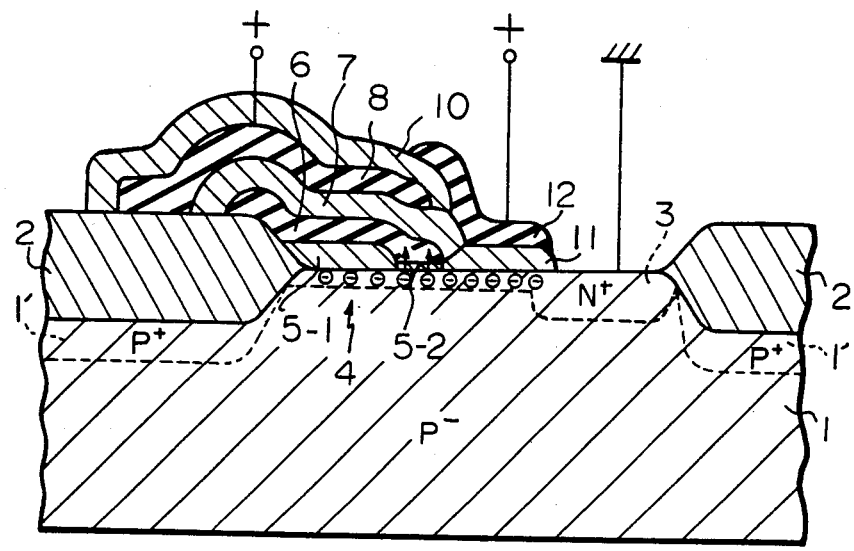
FIGS. 7A and 7B are cross-sectional views for explaining the write operation and the erase operation, respectively, of the memory cell of FIG. 6.

The write operation of the memory cell of FIG. 6 will be explained with reference to FIG. 7A. That is, the potential of the bit line terminal B remains low (zero), and, in addition, the potentials of the word line terminal W and the program terminal P are both increased to a high voltage. As a result, a channel forms very quickly and extends beneath the third gate 12, the thin portion 5-2 and the thick portion 5-1 so that electrons flow through the thin portion 5-2 into the floating-gate 6 due to the tunnel effect.

Note that if the write operation is not desired, the potential of the bit line terminal B is also increased to a high voltage. As a result, no channel is generated under the third gate 12, and, accordingly, no channel is generated under the floating-gate 6, that is, in the channel region 4. Therefore, no electrons are injected into the floating-gate 6 through the thin portion 5-2.

Figure 7B:
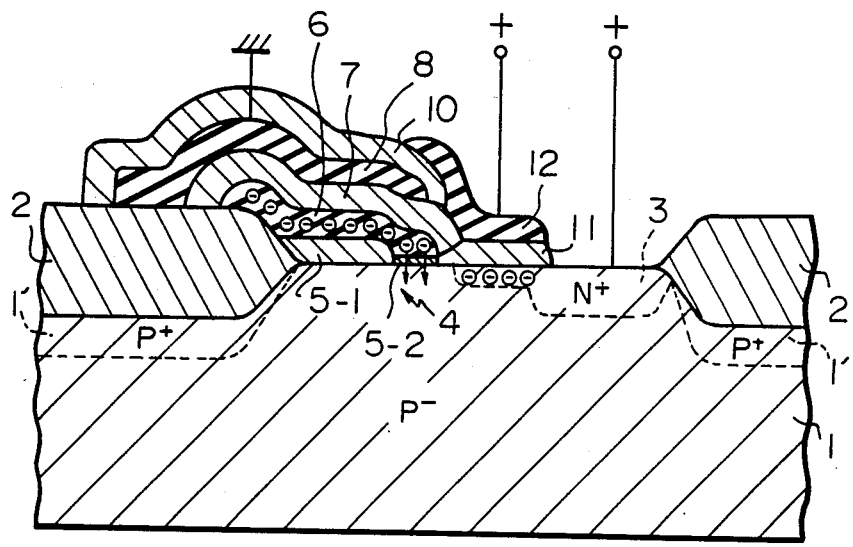

The erase operation of the memory cell of FIG. 6 will be explained with reference to FIG. 7B. That is, the potentials of the bit line terminal B and the word line terminal W are increased to a high voltage, and, in addition, the potential of the program terminal P remains low (zero). In this case, the potential of the word line terminal W is higher than that of the bit line terminal B by a threshold value so that a channel is generated under the third gate 12, as is illustrated in FIG. 7B. However, no channel is generated in the channel region 4 of the substrate 1. Since the potential of the bit line terminal B is higher than that of the floating-gate 6, electrons pass from the floating-gate 6 through the thin portion 5-2 into the substrate 1. As a result, the floating-gate 6 is discharged, and, accordingly, the erase operation is completed.

Figure 8A:
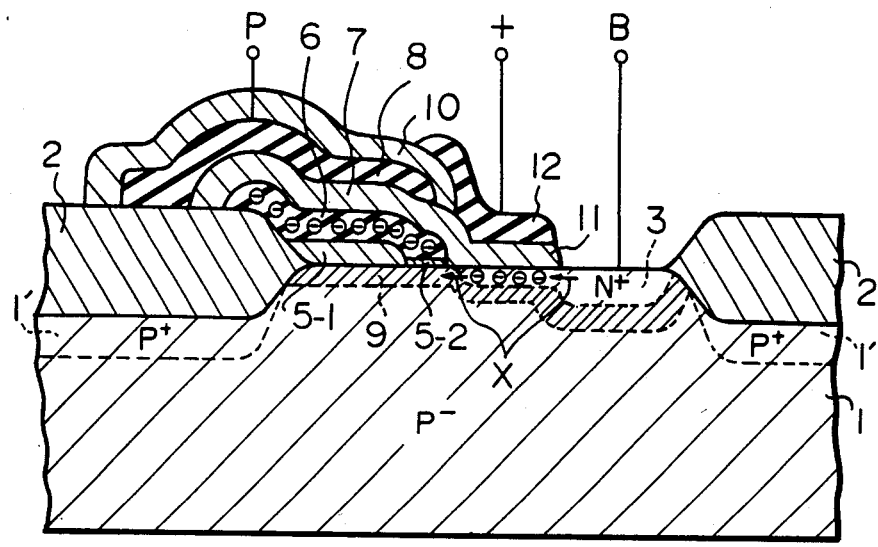
FIGS. 8A and 8B are cross-sectional views for explaining the read operation of the memory cell of FIG. 6.
Figure 8B:
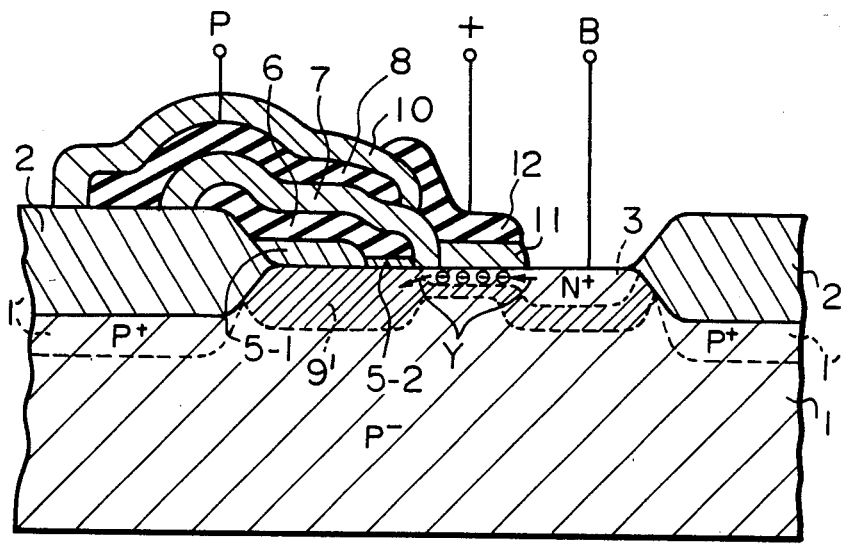

Next, the read operation of the memory cell of FIG. 6 will be explained with reference to FIGS. 8A and 8B. FIG. 8A shows the state in which electrons are accumulated in the floating-gate 6, while FIG. 8B shows the state in which no electrons are present in the floating-gate 6. During the read operation, the potential of the bit line terminal B is in a floating state, and the potential of the word line terminal W is so high that a channel is generated under the third gate 12, as illustrated in FIGS. 8A and 8B. In addition, a predetermined positive voltage is applied to the program terminal P.

In the same way as in FIGS. 3A and 3B, a small depletion region 9 and a large depletion region 9' appear, respectively, in the channel region 4 of FIGS. 8A and 8B. Therefore, in FIG. 8A, when a positive voltage is applied to the program terminal P, the small depletion region 9 increases so that electrons flow from the impurity region 3 through the channel built under the third gate 12 into the depletion region 9, as indicated by the arrows X. Similarly, in FIG. 8B when a positive voltage is applied to the program terminal P, the large depletion region 9' increases so that electrons flow from the impurity region 3 through the channel built under the third gate 12 into the depletion region 9', as indicated by the arrows Y. Of course, also in this case, the current due to the motion of electrons in FIG. 8B is much larger than the current due to the motion of electrons in FIG. 8A.

Note that if the potential of the word line terminal W is low so that no channel is generated under the third gate 12, the read operation is not performed in FIGS. 8A and 8B. This is because the channel region 4 is disconnected from the impurity diffusion region 3 due to the absence of a channel under the third gate 12. Therefore, the stray capacitance of the bit line terminal B becomes small, thereby increasing the read speed.

Figure 9:
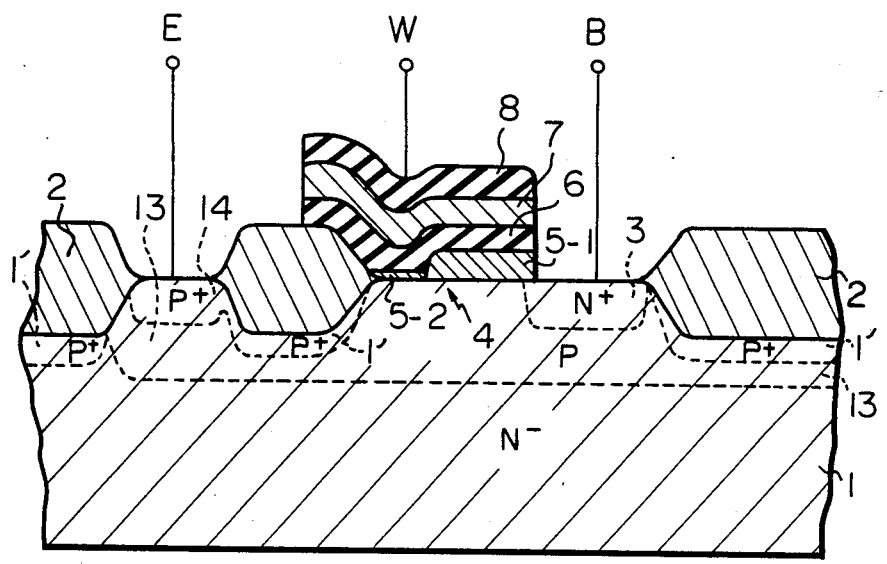
FIG. 9 is a cross-sectional view illustrating a fourth embodiment of one memory cell of the nonvolatile semiconductor memory device according to the present invention.

FIG. 9 is a cross-sectional view illustrating a fourth embodiment of one memory cell of the nonvolatile semiconductor memory device according to the present invention. The memory cell of FIG. 9 is manufactured by means of C MOS (Complementary Metal-Oxide-Semiconductor) manufacturing technology. In FIG. 9, the elements 1' and 3 through 8 are formed in or on a P-well 13 which is formed within an $N^-$-type monocrystalline silicon substrate 1. In addition, the floating-gate 6 is insulated from the substrate 1 by an insulating layer having a thick portion 5-1 adjacent to the impurity diffusion region 3 and a thin portion 5-2 apart from the impurity diffusion region 3. Further, on the side of the field insulating layer 2, which is not adjacent to the impurity channel region 3, an impurity region 14 of the same type as the P-well 13 is formed. An erase electrode E for the erase operation is taken out of the $P^+$-type impurity region 14. Note that this electrode E is formed commonly for all bits or commonly for one word.

Figure 10A:
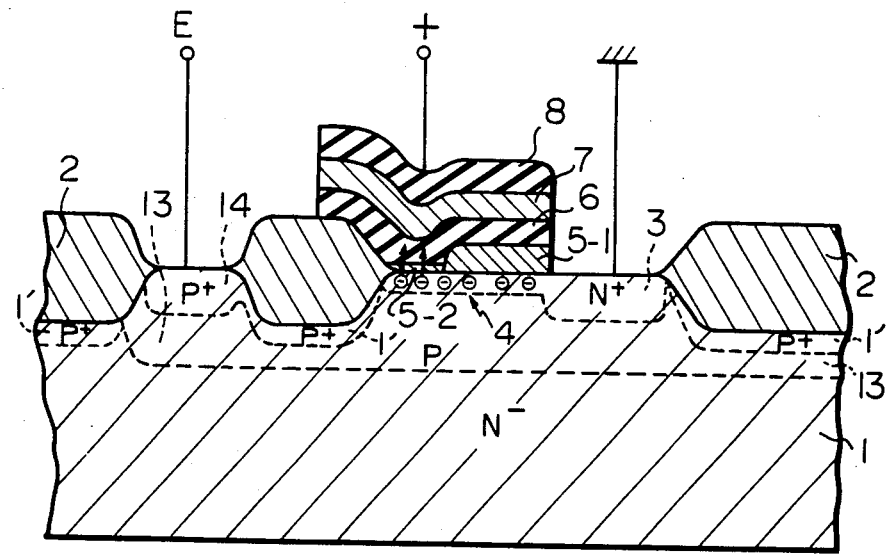
FIGS. 10A and 10B are cross-sectional views for explaining the write operation and the erase operation, respectively, of the memory cell of FIG. 9.

The write operation of the memory cell of FIG. 9 will be explained with reference to FIG. 10A. That is, the potential of the bit line terminal B remains low (zero), and, in addition, the potential of the word line terminal W is increased to a high voltage. As a result, a channel is formed in the channel region 4 and extends beneath the thick portion 5-2 so that electrons flow through the thin portion 5-2 and into the floating-gate 6 due to the tunnel effect. Note that if the write operation is not desired, the potentials of the bit line terminal B and the word line terminal W are both increased to a high voltage so that no channel is separated in the channel region 4.

Figure 10B:
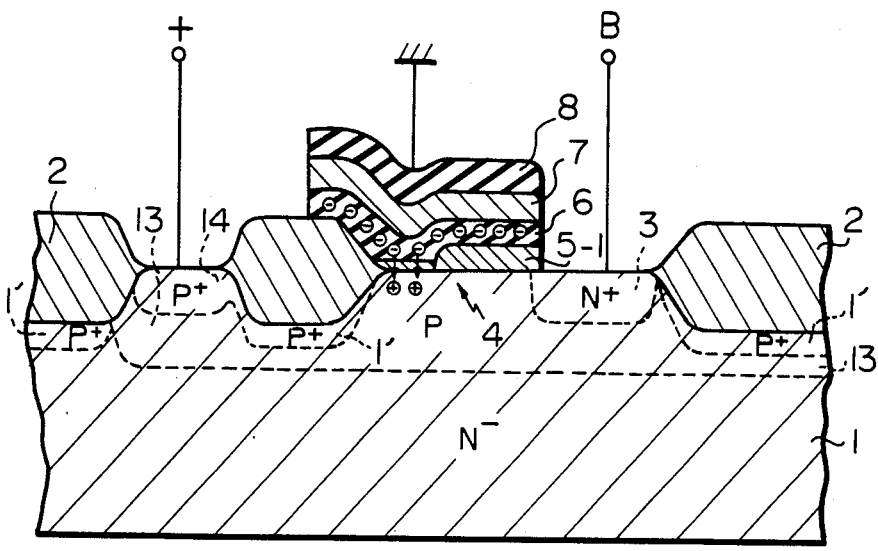

The erase operation of the memory cell of FIG. 9 will be explained with reference to FIG. 10B. That is, the potential of the word line terminal W remains low (zero), and, in addition, the potential of the erase electrode E is increased to a high voltage. In this state, the substrate 1 (the P-well 13) under the thin portion 5-2 is of the P-type. Therefore, the electrons of the floating-gate 6 are expelled into the P-type portion of the substrate 1. Thus, the floating-gate 6 is discharged, and, accordingly, the erase operation is completed.

The read operation of the memory cell of FIG. 9 is the same as that of the memory cell of FIG. 1 or FIG. 4. In this case, the potential of the erase electrode E remains low (zero).

Thus, in the memory cell of FIG. 9, since the thick portion 5-1 is adjacent to the impurity region 3, no tunnel effect is generated even when the potential of the bit line terminal B is positive and the potential of the word line terminal W is low (zero) during the read operation. Therefore, the information stored in the device of FIG. 9 can hardly be erased; in other words, the retention characteristics are improved.

Figure 11:
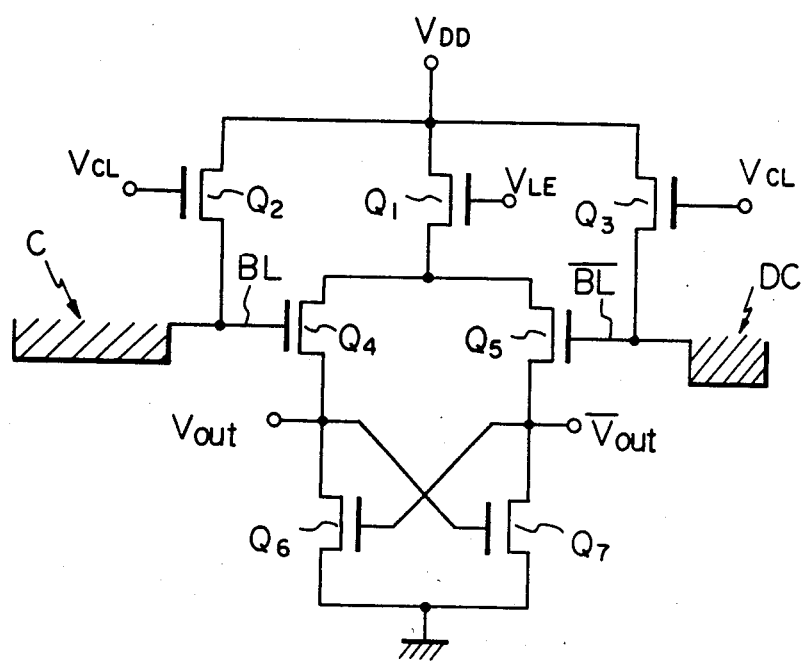
FIG. 11 is a circuit diagram of a sense amplifier circuit used for sensing the output signal of the memory cells of FIGS. 1, 4, 6 and 9 during the read operation.

FIG. 11 is a circuit diagram of a sense amplifier circuit used for sensing the output signal of the memory cells of FIGS. 1, 4, 6 and 9 during the read operation. In FIG. 11, $Q_1$, $Q_2$ and $Q_3$ are gate transistors; $Q_4$ and $Q_5$ are load transistors; and $Q_6$ and $Q_7$ are driver transistors. Reference character C schematically shows a depletion region of the device of FIG. 1, FIG. 4, FIG. 6 or FIG. 9 (which is, in this case, the large depletion region 9' of FIG. 3B or FIG. 8B), and DC schematically shows a depletion region of a dummy cell, which has the same structure as the memory cell of FIG. 1, FIG. 4, FIG. 6 or FIG. 9, respectively but has a channel region having about half the area of that in the memory cell of FIG. 1, FIG. 4, FIG. 6 or FIG. 9, respectively.

The operation of the circuit of FIG. 11 will now be explained. First, the potential of a column selection signal $V_{CL}$ is increased to a high voltage so as to turn on the transistors $Q_2$ and $Q_3$. As a result, the potentials of the two bit lines BL and $\overline{BL}$ which are connected to the depletion regions C and DC, respectively, are equalized. After that, the potential of the signal $V_{CL}$ is decreased to a low voltage, and, accordingly, the transistors $Q_2$ and $Q_3$ are cut off so that the bit lines BL and $\overline{BL}$ are in a floating state. In this state, when a positive voltage is applied to the word line terminal W of FIG. 1, FIG. 4 or FIG. 6 (or the program terminal P of FIG. 9), and simultaneously such a positive voltage is applied to the word line terminal (not shown) of the dummy cell, charges, which are in this case electrons, are injected into both the depletion regions C and DC. In this case, the quantity of electrons injected into the depletion region C is larger than the quantity of electrons injected into the depletion region DC. As a result, the potential of the bit line BL connected to the depletion region C becomes lower than the potential of the bit line $\overline{BL}$ connected to the depletion region DC. Such potentials are transmitted to the gates of the load transistors $Q_4$ and $Q_5$. Next, the potential of a latch-enable signal $V_{LE}$ is increased to a high voltage so as to operate a flip-flop formed by the transistors $Q_1$, $Q_4$, $Q_5$, $Q_6$ and $Q_7$. As a result, the potentials of output signals $V_{out}$ and $\overline{V}_{out}$ become high and low, respectively, and the sensing operation performed by the circuit of FIG. 11 is completed.

Contrary to the above, if the depletion region C shows the small depletion region 9 of FIG. 3B or FIG. 8B, the potentials of the output signals $V_{out}$ and $\overline{V}_{out}$ become low and high, respectively.

Next, the method for manufacturing the memory cells of FIGS. 1, 4, 6 and 9 according to the present invention will now be explained.

FIGS. 12(1) through 12(5) are cross-sectional views for explaining the manufacturing steps of the memory cell of FIG. 1. First, as is illustrated in FIG. 12(1), a $p^-$-type monocrystalline silicon substrate 1 is oxidized in an oxidization atmosphere at a high temperature, 1100° C. for example, so as to grow a silicon dioxide ($SiO_2$) layer 21 thereon. After that, a silicon nitride ($Si_3N_4$) layer 22 is deposited and a photoresist pattern 23 is formed thereon so as to form a pattern of the $Si_3N_4$ layer 22. In this state, acceptor atoms such as boron atoms (B+) are introduced thereon under the masks of the photoresist pattern 23 and the $Si_3N_4$ layer 22 in order to form an impurity region 1' which serves as a channel stopper (see FIG. 12(2)). Then the photoresist pattern 23 is removed.

Next, as is illustrated in FIG. 12(2), oxidization is performed in a wet or steam oxidation atmosphere under the pattern of the $Si_3N_4$ layer 22 so as to form a field insulating layer 2 of silicon dioxide ($SiO_2$). Then, the patterns of the $Si_3N_4$ layer 22 and the $SiO_2$ layer 21 are removed.

Next, as is illustrated in FIG. 12(3), oxidization is again performed so as to form a first insulating layer 5 of silicon dioxide ($SiO_2$) which is, for example, 100 to 120 Å thick; thereafter, a polycrystalline silicon layer is deposited thereon so as to form a floating-gate 6. Usually, the resistance of the polycrystalline silicon layer is reduced by introducing impurity atoms such as phosphorus atoms thereinto.

Next, as is illustrated in FIG. 12(4), a pattern of a second insulating layer 7 is formed by thermal oxidization or chemical vapor deposition (CVD); thereafter, a polycrystalline silicon layer is deposited so as to form a control gate 8. Then the portion 5' of the first insulating layer 5 is removed.

Next, as is illustrated in FIG. 12(5), doner atoms such as phosphorus (P) or arsenic (As) atoms are introduced so as to form a single impurity region 3. Thus, the memory cell of FIG. 1 is obtained.

Figure 13:
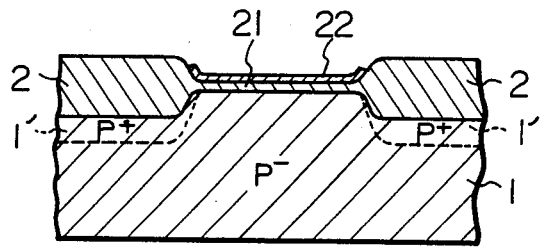
FIGS. 13 (1) through 13 (5) are cross-sectional views for explaining the manufacturing steps of the memory cell of FIG. 4.
Figure 13:
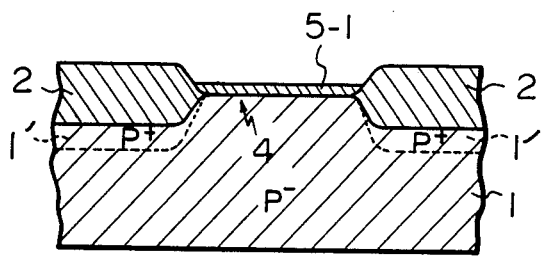
Figure 13:
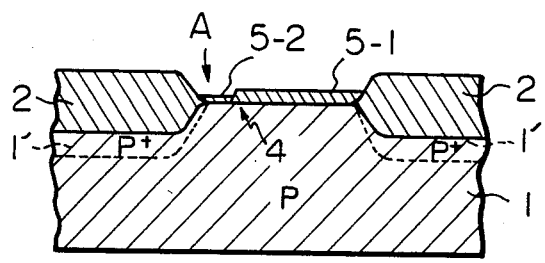

FIGS. 13(1) through 13(5) are cross-sectional views for explaining the memory cell of FIG. 4. First, in FIG. 13(1), in the same way as in FIGS. 12(1) and 12(2), the impurity region 1' and the field insulating layer 2 are formed on the $N^-$-type substrate 1. Then the patterns of the $Si_3N_4$ layer 22 and the $SiO_2$ layer 21 are removed.

Next, as is illustrated in FIG. 13(2), oxidization is performed so as to form a thick portion 5-1 of a first insulating layer of silicon dioxide ($SiO_2$). In this case, the thickness of the thick portion 5-1 is about 500 to 1200 Å.

Next, as is illustrated in FIG. 13(3), a photoresist pattern (not shown) is formed so as to etch one part of the thick portion 5-1, indicated by an arrow A. After the photoresist pattern is removed, oxidization is again performed so as to form a thin portion 5-2 of the first insulating layer. In this case, the thickness of the thin portion 5-2 is about 100 to 120 Å.

Next, as is illustrated in FIG. 13(4), a first polycrystalline silicon layer, which serves as the floating-gate 6, a second insulating layer 7, and a second polycrystalline silicon layer, which serves as the control gate 8, are formed. Note that the resistance of both the first polycrystalline silicon layer and the second polycrystalline silicon layer is reduced by introducing atoms such as phosphorus atoms (P+) thereinto. In addition, the second insulating layer 7 is obtained by thermal oxidization or CVD.

Next, as is illustrated in FIG. 13(5), a photoresist pattern (not shown) is formed; thereafter, all the layers 5-1, 6, 7 and 8 are etched under the mask of this photoresist pattern by means of the dry or plasma etching method. Thus, the first insulating layer having a thick portion 5-1 and a thin portion 5-2, the floating-gate 6, the second insulating layer 7 and the control gate 8 are layered in this order from the bottom. Then the photoresist pattern is removed; thereafter, doner atoms such as phosphorus (P) atoms or arsenic (As) atoms are introduced therein to so as to form a single impurity region 3. Thus, the memory cell of FIG. 4 is obtained.

Figure 14:
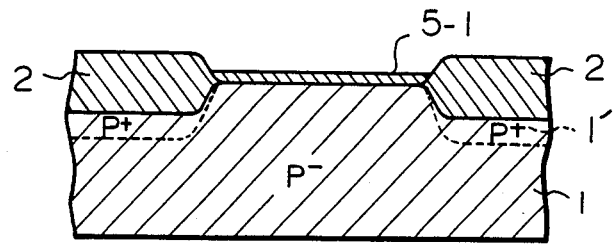
FIGS. 14 (1) through 14 (6) are cross-sectional views for explaining the manufacturing steps of the memory cell of FIG. 6.
Figure 14:
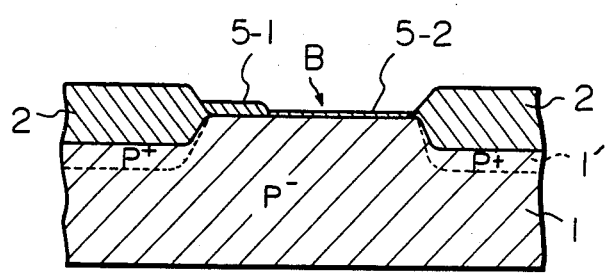
Figure 14:
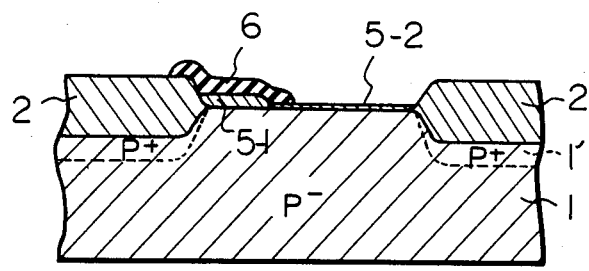

FIGS. 14(1) through 14(6) are cross-sectional views for explaining the manufacturing steps of the memory cell of FIG. 6. First, in FIG. 14(1), in the same way as in FIGS. 13(1) and 13(2), the impurity region 1', the field insulating layer 2 and the thick portion 5-1 of the first insulating layer are formed on the substrate 1.

Next, as is illustrated in FIG. 14(2), a photoresist pattern is formed so as to etch one part of the thick portion 5-1, indicated by an arrow B. After the photoresist pattern is removed, oxidization is again performed so as to create a thin portion 5-2 of the first insulating layer. After that, a pattern of polycrystalline silicon is deposited thereon so as to form a floating-gate 6. In this case, the floating-gate 6 is placed on the thick portion 5-1 and extends over one part of the thin portion 5-2. In addition, usually the resistance of the polycrystalline silicon layer is reduced by introducing atoms such as phosphorus atoms.

Next, as is illustrated in FIG. 14(4), a second insulating layer 7 is formed by thermal oxidization or CVD; thereafter, a pattern of polycrystalline silicon is deposited thereon so as to form a control gate 8. Usually, the resistance of this polycrystalline silicon layer is also reduced by introducing atoms such as phosphorus atoms.

Next, as is illustrated in FIG. 14(5), a third insulating layer 10 of silicon dioxide (SiO$_2$) and a fourth insulating layer 11 of silicon dioxide (SiO$_2$) are formed thereon by thermal oxidization or CVD.

Next, as is illustrated in FIG. 14(6), a pattern of polycrystalline silicon is deposited thereon so as to form a third gate 12. After that, one part of the insulating layer 11, indicated by an arrow C, is removed; thereafter, doner atoms such as phosphorus (P) atoms or arsenic (As) atoms are introduced thereinto so as to form a single impurity region 3. Thus, the memory cell of FIG. 9 is obtained.

Figure 15:
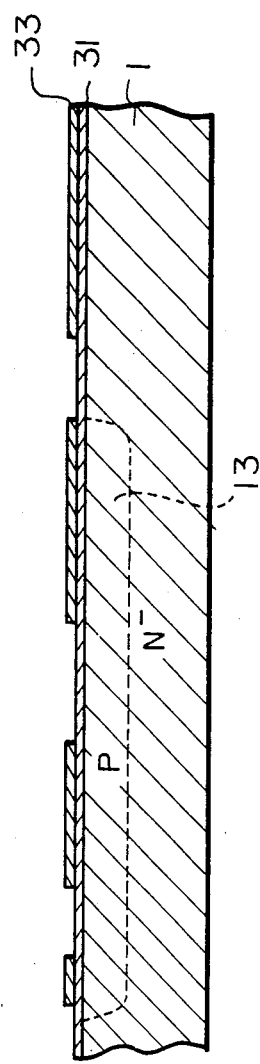
FIGS. 15 (1) through 15 (11) are cross-sectional views for explaining the manufacturing steps of the memory cell of FIG. 9.
Figure 15:
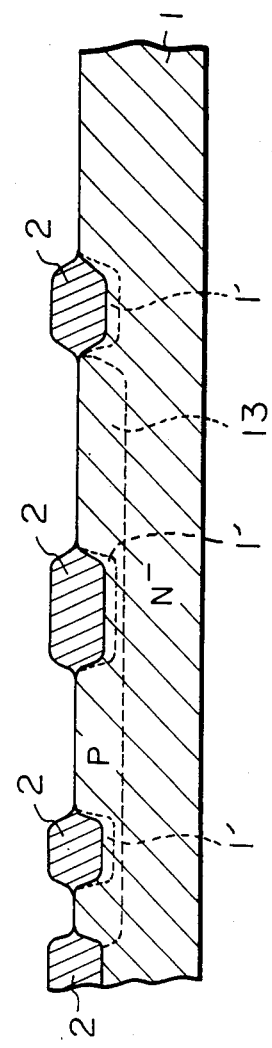
Figure 15:
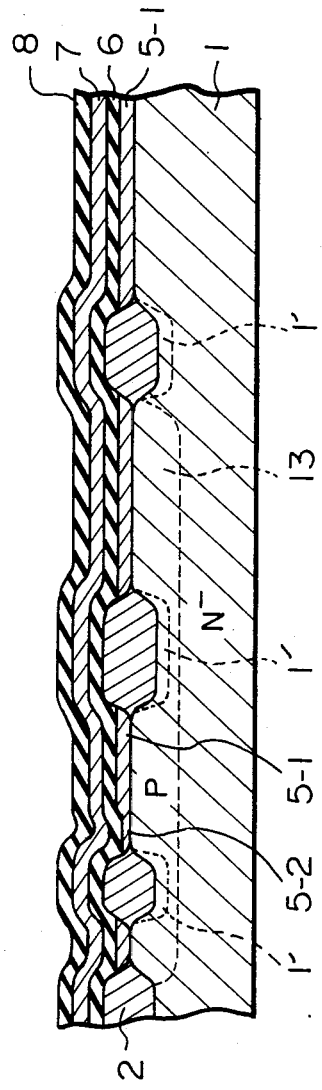
Figure 15:
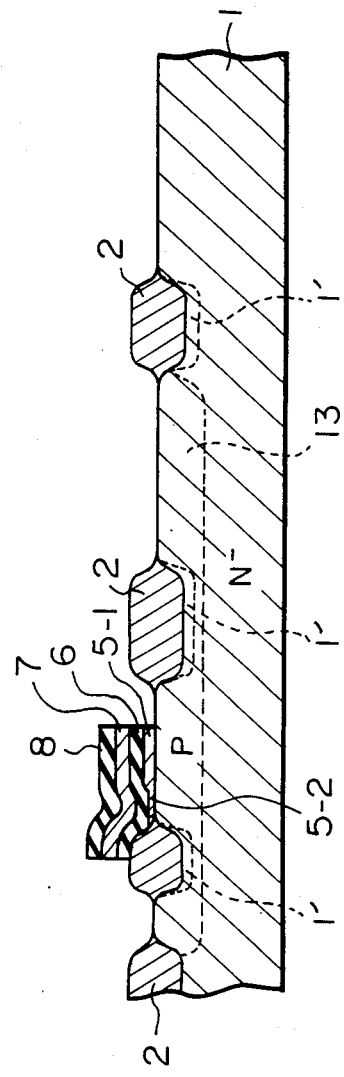
Figure 15:
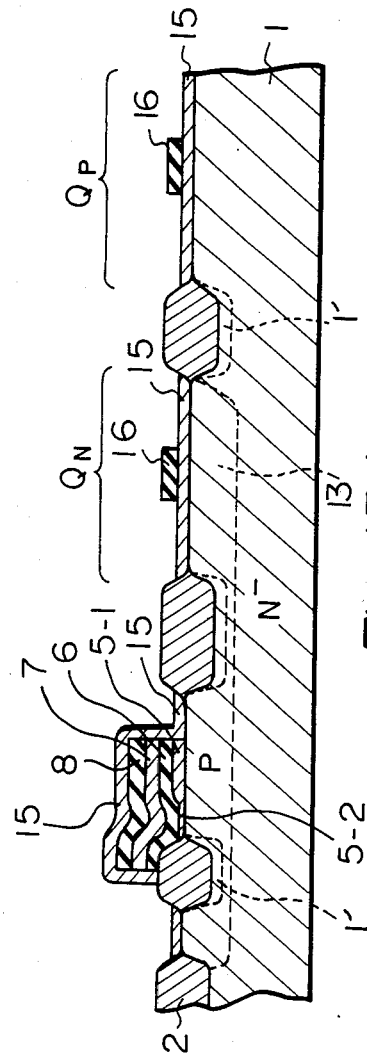
Figure 15:
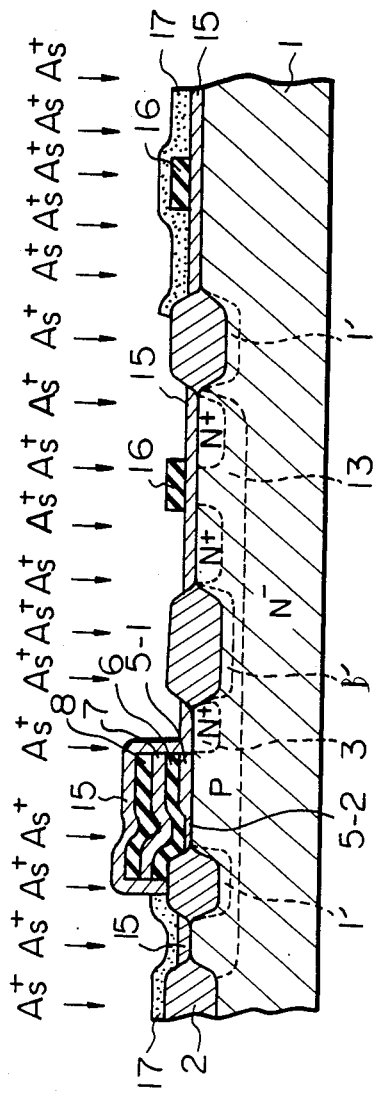

FIGS. 15(1) through 15(10) are cross-sectional views for explaining the manufacturing steps of the memory cell of FIG. 9. Note that the memory cell of FIG. 9 is manufactured by making use of C MOS technology. Therefore, when the memory cell of FIG. 9 is incorporated with a C MOS integrated circuit, the memory cell of FIG. 9 has the same advantages as a C MOS circuit in that the power dissipation is low and the operation speed is high and in that it is easy to operate at a low voltage.

First, as is illustrated in FIG. 15(1), an N$^-$-type monocrystalline silicon substrate 1 is oxidized so that a silicon-dioxide (SiO$_2$) layer 31 is formed thereon. In addition, a photoresist pattern 32 is formed; thereafter, doner atoms such as boron atoms (B+) are introduced thereinto under the photoresist pattern 32 so that a P-well 13 is formed as is illustrated in FIG. 15(2). Then the photoresist pattern 32 is removed.

Next, as is illustrated in FIG. 15(2), a silicon nitride (Si$_3$N$_4$) layer 33 is deposited on the SiO$_2$ layer 31, and, in addition, a photoresist pattern 34 is formed thereon. After the Si$_3$N$_4$ layer 33 is etched under the mask of the photoresist pattern 34, boron atoms (B+) are introduced thereinto under the mask of the photoresist pattern 34 and the Si$_3$N$_4$ layer 33 so as to form an impurity region 1', which serves as a channel stopper (see FIG. 14(4)). Then the photoresist pattern 34 is removed.

Next, as is illustrated in FIG. 15(3), an additional pattern is made on the Si$_3$N$_4$ layer 33 by using another photoresist pattern (not shown).

Next, as is illustrated in FIG. 15(4), oxidization is performed under the mask of the Si$_3$N$_4$ layer 33 (FIG. 15(3)) so as to form a field insulating layer 2. Then the Si$_3$N$_4$ layer 33 and the SiO$_2$ layer 31 are removed.

Next, as is illustrated in FIG. 15(5), oxidization is performed so as to form a thick portion 5-1 of a first insulating layer which is, for example, about 500 to 1200 Å thick.

Next, as is illustrated in FIG. 15(6), a photoresist pattern (not shown) is formed so as to etch one part of the thick portion 5-1, indicated by an arrow D. After this photoresist pattern is removed, oxidization is performed so as to form a thin portion 5-2 which is, for example, 100 to 120 Å thick.

Next, as is illustrated in FIG. 15(7), the first polycrystalline silicon layer, which serves as the floating-gate 6, a second insulating layer 7, and the second polycrystalline silicon layer, which serves as the control gate 8, are formed. Usually, the resistance of both the first polycrystalline silicon layer and the second polycrystalline silicon layer is reduced by introducing atoms such as phosphorus atoms (P+) thereinto. In addition, the second insulating layer 7 is obtained by thermal oxidization or CVD.

Next, as is illustrated in FIG. 15(8), a photoresist pattern (not shown) is formed; thereafter, all the layers are etched under the mask of this photoresist pattern by means of the dry or plasma etching method. Thus, the first insulating layer having a thick portion 5-1 and a thin portion 5-1, the floating-gate 6, the second insulating layer 7, and the control gate 8 are layered in this order from the bottom.

Next, as is illustrated in FIG. 15(9), oxidization is performed so as to form an insulating layer 15; thereafter, a polycrystalline silicon layer is deposited so as to form gates for an N-channel transistor $Q_N$ and a P-channel transistor $Q_P$.

Next, as is illustrated in FIG. 15(10), a photoresist pattern 17 is formed; thereafter, doner atoms such as arsenic atoms (As+) are introduced thereinto through the insulating layer 15 so as to form a single impurity diffusion region 3 as well as two N+-type impurity diffusion regions for the transistor $Q_N$. Then the photoresist pattern 17 is removed.

Next, as is illustrated in FIG. 15(11), a photoresist pattern 18 is formed; thereafter, acceptor atoms such as boron ions (B+) are introduced thereinto through the insulating layer 15 so as to form an impurity diffusion region 15 as well as two P+-type impurity diffusion regions for the transistor $Q_P$. Thus the memory cell of FIG. 9, as well as other C MOS elements, is obtained.

As explained hereinbefore, the nonvolatile semiconductor memory device according to the present invention has an advantage in that a high integration density can be obtained, as compared with the conventional device in which two inpurity diffusion regions are necessary for each bit.

We claim:

1. A nonvolatile semiconductor memory device including at least one memory cell formed on a semiconductor substrate of P-type conductivity, each said memory cell comprising:
    only one region of N-type conductivity formed exclusively for the memory cell in said semiconductor substrate, said region having a contact for controlling its potential;
    a first insulating layer formed on said substrate adjacent said N-type region, said first insulating layer including a thin portion over said substrate through which tunneling by carriers occurs;
    a first gate formed on said first insulating layer including on said thin portion and adjacent to said N-type region;
    a second gate formed above said first gate and insulated therefrom, said second gate having a contact for controlling its potential; and
    means for selectively writing electrons as stored data into said first gate by said tunneling through said thin portion of said insulating layer, for erasing said stored data and for reading said stored data, including a word electrode connected to said contact of said second gate and a bit electrode connected to said contact of said N-type region, wherein for said selective writing a first positive potential is applied to said word line and said bit electrode is provided with a predetermined one of ground potential and a respective positive voltage, for said erasing a negative potential is applied to said word electrode and a respective positive potential is supplied to said bit electrode, and for said reading a second positive potential is applied to said word line and said bit electrode is floated electrically;
    wherein said first gate is capable of being placed in charged and discharged states with respective depletion regions of different sizes in said substrate under said first gate as a result of the respective potentials being supplied to said contacts of said N-type region and second gate.

2. A device as set forth in claim 1, wherein said first gate is changed in both directions between said charged and discharged states by applying the respective potentials to said contacts of said N-type region and said second gate so as to cause said tunneling in both respective directions.

3. A device as set forth in claim 2, wherein said thin portion of said first insulating layer is approximately 100 to 120 Å thick silicon dioxide ($SiO_2$).

4. The device of claim 1, comprising means selectively connected to said bit electrode for discriminating between the currents that flow from said N-type region to the respective depletion regions corresponding to said charged and discharged states during said reading.

5. The device of claim 1, wherein said erasing occurs by tunneling of said electrons through said thin portion of said first insulating layer.

6. The device of claim 1, wherein, said second positive potential is less than said first positive potential.

7. A device as set forth in claim 1, further comprising a third gate above said semiconductor substrate and between said N-type region and said first gate, said third gate being insulated from said semiconductor substrate and from said first and second gates, said thin portion of said insulating film being adjacent said third gate and said third gate having a contact for controlling its potential to provide a channel under said third gate to control when said tunneling occurs.

8. A device as set forth in claim 7, wherein said third gate is composed of polycrystalline silicon.

9. The device of claim 7, comprising reading means for discriminating between the currents that flow between said N-type region and the respective depletion regions corresponding to said charged and discharged states when a voltage is applied to said contact of said second gate so as to increase each of said depletion region.

10. A nonvolatile semiconductor memory device including at least one memory cell formed on a semiconductor substrate of P-type conductivity, each said memory cell comprising:
    only one region of N-type conductivity formed exclusively for the memory cell in said semiconductor substrate, said region having a contact for controlling its potential;
    a first insulating layer formed on said substrate adjacent said single region, said firs insulating layer including a thin portion over said substrate through which tunneling by carriers occurs;
    a first gate formed on said first insulating layer including on said thin portion and adjacent to said N-type region;
    a second gate formed above said first gate and insulated therefrom, said second gate having a contact for controlling its potential; and
    means for selectively writing electrons as stored data into said first gate by said tunneling through said thin portion of said insulating layer, for erasing said stored data and for reading said stored data, including a word electrode connected to said contact of said second gate and a bit electrode connected to said contact of said N-type region, wherein for the selective writing a first positive potential is applied to said word line and said bit electrode is provided with a predetermined one of ground potential and a respective positive voltage, for said erasing ground potential is applied to said word electrode and a respective positive potential is supplied to said bit electrode, and for said reading a second positive potential is applied to said word electrode and said bit electrode is floated electrically;
    wherein said first gate is capable of being placed in charged and discharged states, with respective depletion regions of different sizes in said substrate under said first gate during said reading as a result of the respective potential supplied to said contact of said second gate; and wherein said thin portion of said first insulating layer is spaced apart from said N-type region, said first insulating layer having a thick portion adjacent to said N-type region, and said first gate is discharged for said erasing by applying the respective potentials to said semiconductor substrate and to said N-type region so as to cause avalanche breakdown, causing carriers to pass over a potential barrier of said thick portion of the first insulating layer to discharge said first gate.

11. The device of claim 10, comprising means connected to said bit electrode for discriminating between the currents that flow from said single region to the respective depletion regions corresponding to said charged and discharged states during said reading.

12. A device as set forth in claim 1, wherein said P-type conductivity of said substrate is provided by a P-type well region in said semiconductor substrate, and said semiconductor substrate further comprises a semiconductor layer of N-type conductivity extending in common beneath said well region.

13. A device as set forth in claim 10 or 12, wherein the thin portion of said insulating layer is approximately 100 to 120 Å thick silicon dioxide (SiO$_2$) and the thick portion of said insulating layer is approximately 500 to 1200 Å thick silicon dioxide (SiO$_2$).

14. A device as set forth in claim 1 or 12, wherein said first and second gates are composed of polycrystalline silicon.

15. A device as set forth in claim 14, wherein said first gate is surrounded by thermally grown silicon dioxide (SiO$_2$).

16. The device of claim 6, wherein every portion of said second gate is separated from said well region by said first gate.

17. The device of claim 12 or 16, comprising means for discriminating between the respective currents that flow from said N-type region to the respective depletion region during said reading when said voltage is supplied to said contact of said second gate as compared to the respective current for the other state.

18. A nonvolatile semiconductor memory device including at least one memory cell formed on a semiconductor substrate of P-type conductivity, each said memory cell comprising:

only one region of N-type conductivity formed exclusively for the memory cell in said semiconductor substrate, said region having a contact for controlling its potential;

a first insulating layer formed on said substrate adjacent said N-type region, said first insulating layer including a thin portion over said substrate through which tunneling by carriers occurs;

a first gate formed on said first insulating layer including on said thin portion and adjacent to said N-type region;

a second gate formed above said first gate and insulated therefrom, said second gate having a contact for controlling its potential;

a third gate above said semiconductor substrate and between said N-type region and said first gate, said third gate being insulated from said semiconductor substrate and from said first and second gates, said thin portion of said insulating film being adjacent said third gate and said third gate having a contact for controlling its potential to provide a channel under said third gate:

a program electrode connected to said contact of said second gate, a word electrode connected to said contact of said third gate, and a bit electrode connected to said contact of said N-type region, means for selectively writing electrons as said carriers into said first gate, and for erasing and reading said charged and discharged states, wherein for the selective writing a first positive potential is supplied to said program electrode and said bit electrode is selectively grounded or supplied with a respective positive voltage, depending on whether said charged or discharged state is selected, and a respective positive voltage is supplied to said word electrode, for said erasing respective positive voltages are applied to said word and bit electrodes and said program electrode is grounded, and for said reading respective positive voltages are supplied to said program and word electrodes, while said bit electrode is electrically floated; and wherein said first gate is capable of being placed in charged and discharged states, with respective depletion regions of different sizes in said substrate under said first gate during said reading as a result of the potential supplied to said contact of said second gate.

* * * * *

UNITED STATES PATENT AND TRADEMARK OFFICE
CERTIFICATE OF CORRECTION

PATENT NO. : 4,672,409
DATED : JUNE 9, 1987
INVENTOR(S) : AKIRA TAKEI ET AL.

It is certified that error appears in the above-identified patent and that said Letters Patent is hereby corrected as shown below:

FRONT PAGE [73], "Kanagawa" should be --Kawasaki-Shi--

FRONT PAGE, Col. 2, last line, "43 Drawing Figures" should be --44 Drawing Figures--.

Col. 7, line 47, after "respectively" insert --,--.

Col. 10, line 24, "14(4)" should be --15(4)--;
        line 58, "5-1" should be --5-2--.

Col. 12, line 38, "firs" should be --first--.

Col. 13, line 33, "6" should be --12--.

Signed and Sealed this

Twenty-sixth Day of July, 1988

Attest:

DONALD J. QUIGG

Attesting Officer     Commissioner of Patents and Trademarks